(12) United States Patent
Koizumi (10) Patent No.: US 8,274,105 B2
(45) Date of Patent: Sep. 25, 2012

(54) IMAGE PICKUP DEVICE AND CAMERA

(75) Inventor: Toru Koizumi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 15 days.

(21) Appl. No.: 13/043,808

(22) Filed: Mar. 9, 2011

(65) Prior Publication Data

US 2011/0156196 A1    Jun. 30, 2011

Related U.S. Application Data (60) Continuation of application No. 12/563,204, filed on Sep. 21, 2009, now Pat. No. 7,939,868, which is a division of application No. 11/782,295, filed on Jul. 24, 2007, now Pat. No. 7,679,114, which is a division of application No. 11/213,833, filed on Aug. 30, 2005, now Pat. No. 7,348,615.

(30) Foreign Application Priority Data

Sep. 1, 2004    (JP) ................................. 2004-254362

(51) Int. Cl.
*H01L 31/062* (2012.01)
(52) U.S. Cl. ................................ 257/292; 257/E27.132
(58) Field of Classification Search .................. 257/213, 257/288, 290, 291, 292, 293, 294, E27.132, 257/E27.133

See application file for complete search history.

(56) References Cited

U.S. PATENT DOCUMENTS

| | | | | |
|---|---|---|---|---|
| 5,698,892 A | 12/1997 | Koizumi et al. | ............. | 257/620 |
| 6,051,447 A * | 4/2000 | Lee et al. | ..................... | 438/48 |
| 6,188,094 B1 | 2/2001 | Kochi et al. | .................. | 257/232 |
| 6,605,850 B1 | 8/2003 | Kochi et al. | .................. | 257/431 |
| 6,670,990 B1 | 12/2003 | Kochi et al. | .................... | 348/310 |
| 6,677,656 B2 | 1/2004 | Francois | .................... | 257/462 |
| 6,946,637 B2 | 9/2005 | Kochi et al. | ................. | 250/208.1 |
| 6,960,751 B2 | 11/2005 | Hiyama et al. | ............ | 250/208.1 |
| 7,016,089 B2 | 3/2006 | Yoneda et al. | ................ | 358/482 |
| 7,110,030 B1 | 9/2006 | Kochi et al. | .................... | 348/308 |
| 7,324,144 B1 | 1/2008 | Koizumi | ...................... | 348/294 |
| 2001/0012133 A1 | 8/2001 | Yoneda et al. | ................ | 358/482 |
| 2002/0093015 A1 | 7/2002 | Furumiya et al. | ................ | 257/53 |
| 2003/0164887 A1 | 9/2003 | Koizumi et al. | ............ | 348/308 |
| 2005/0116251 A1 | 6/2005 | Abe et al. | ....................... | 257/146 |

(Continued)

FOREIGN PATENT DOCUMENTS

JP    2001-230400    8/2001

(Continued)

*Primary Examiner* — Ha Tran T Nguyen
*Assistant Examiner* — Kevin Quinto
(74) *Attorney, Agent, or Firm* — Fitzpatrick, Cella, Harper & Scinto (57) ABSTRACT

An object is to provide a solid state image pickup device and a camera which do not worsen a sensor performance in terms of an optical property, a saturated charge amount and the like. A solid state image sensor including a pixel region having a plurality of pixels includes at least a photodiode and an amplifying portion amplifying photocharges outputted from the photodiode in the pixel region, and further includes a well electrode for taking well potential of a well region in which the amplifying portion is arranged. Between the well electrode and the photodiode, no element isolation regions by an insulation film are arranged. Moreover, on the surface of a first semiconductor region in which the photodiode stores the charges, a second semiconductor layer of a conductivity type reverse to that of the first semiconductor region is arranged.

2 Claims, 8 Drawing Sheets

U.S. PATENT DOCUMENTS

| | | | |
|---|---|---|---|
| 2005/0185074 A1 | 8/2005 | Yoneda et al. | 348/294 |
| 2005/0268960 A1 | 12/2005 | Hiyama et al. | 136/244 |
| 2005/0269604 A1 | 12/2005 | Koizumi et al. | 257/291 |
| 2006/0027843 A1 | 2/2006 | Ogura et al. | 257/291 |
| 2006/0060854 A1 | 3/2006 | Wakano et al. | 257/59 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |
| 2006/0208161 A1 | 9/2006 | Okita et al. | 250/208.1 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |

FOREIGN PATENT DOCUMENTS

| | | |
|---|---|---|
| JP | 2003-258230 A | 9/2003 |
| JP | 2006-041080 A | 2/2006 |
| JP | 2006-073607 A | 3/2006 |

\* cited by examiner

IMAGE PICKUP DEVICE AND CAMERA

CROSS REFERENCE TO RELATED APPLICATIONS

This application is a continuation of U.S. application Ser. No. 12/563,204 filed on Sep. 21, 2009, which is a division of U.S. application Ser. No. 11/782,295 filed on Jul. 24, 2007, which is a division of U.S. application Ser. No. 11/213,833 filed on Aug. 30, 2005, which issued as U.S. Pat. No. 7,348,615, on Mar. 25, 2008. The entire disclosures of these prior applications are incorporated herein by reference.

BACKGROUND OF THE INVENTION

1. Field of the Invention

The present invention relates to an image pickup device and a camera, and more particularly to an image pickup device and a camera in which charges are converted into a voltage in a pixel region to be read as a voltage signal like an active pixel sensor (APS).

2. Description of Related Art

In recent years, a demand for a digital single lens reflex camera has been developing, and a sensor used in the digital single lens reflex camera is sized to be large one from APS-C size to a 35 mm film size.

Moreover, the used sensor itself widely varies from a CCD to an APS and the like.

Japanese Patent Application Laid-Open No. 2001-230400 (corresponding U.S. application was published as U.S. Publication 2001012133A) discloses an amplifying type image pickup device having a plurality of two-dimensionally arranged pixels, each including a photoelectric conversion element and an amplifying transistor, wherein: a first conductivity type semiconductor region constituting each photoelectric conversion element is formed in a common well composed of a second conductivity type semiconductor formed in a first conductivity type semiconductor substrate; a first conductivity type semiconductor region constituting a source and a drain of each of the amplifying transistors is formed in the common well; and a plurality of electric contacts for supplying a reference voltage to the common well is provided in the inside of the pixel array area in the common well.

In the APS sensor which has the large image pickup surface mentioned above, it is necessary to perform a voltage conversion of charges based on certain reference potential. When the reference potential is distributed on the image pickup surface, also the optical signal having received the voltage conversion has shading according to the distribution. Thus, there is a problem in which image performance is seriously damaged.

For coping with the problem, the prior art disclosed in the publication mentioned above provides an electrode for fixing the potential of the well in which a source follower is arranged to the reference potential when the source is used as an amplifying portion in a pixel, for example.

Figure 10:
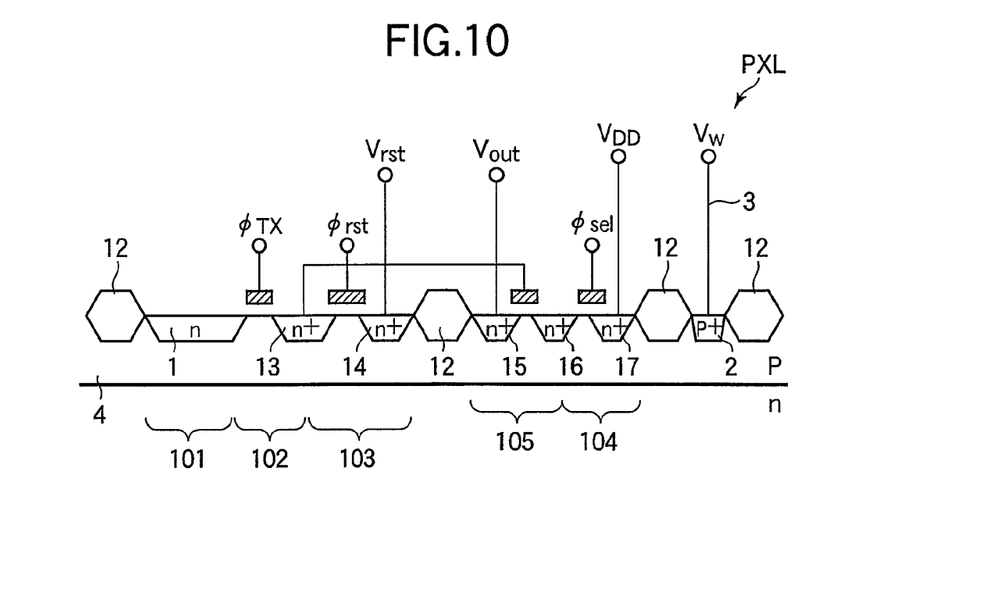
FIG. 10 is a sectional view showing the cross-sectional structure of prior art.

FIG. 10 is a sectional view showing the cross-sectional structure of prior art. In FIG. 10, an electrode region for taking well potential is denoted by a reference numeral 2.

A reference numeral 1 denotes n-type semiconductor region forming a photoelectric conversion region. A reference numeral 2 denotes p-type semiconductor region. A reference numeral 3 denotes a well contact wiring. A reference numeral 4 denotes P-well. A reference numeral 12 denotes an element isolation region. Reference numerals 13-17 denote source and drain regions of MOS transistor. A reference numeral 101 denotes a photoelectric conversion unit. A reference numeral 102 denotes a transfer MOS transistor. A reference numeral 103 denotes a reset MOS transistor. A reference numeral 104 denotes a selection MOS transistor. And, a reference numeral 105 denotes an amplifying MOS transistor.

Figure 11:
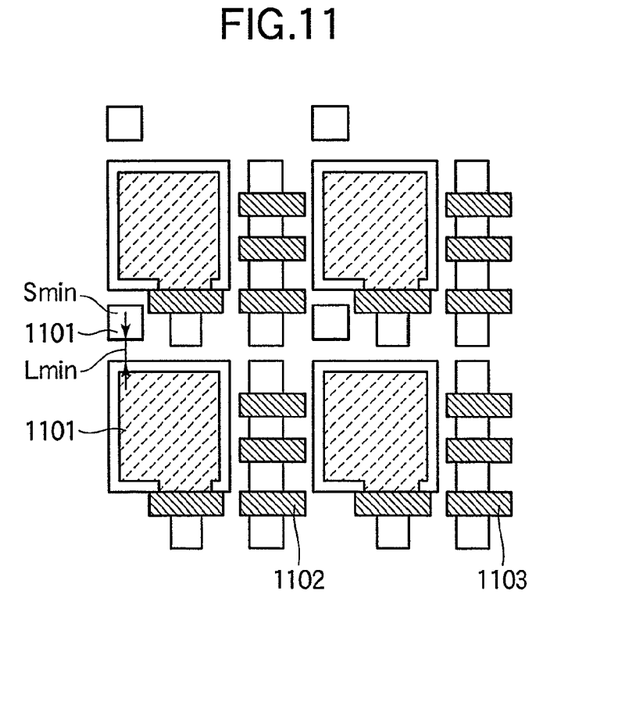
FIG. 11 is a plan view showing the planar structure of the prior art.

FIG. 11 is a plan view showing the planar structure of the prior art. The well region 2 of FIG. 10 corresponds to a well electrode 1101 in FIG. 11.

A reference numeral 1104 denotes a photodiode. A reference numeral 1102 denotes a poly wiring (poly gate). A reference numeral 1103 denotes a MOS transistor unit ($N^+$). $L_{min}$ denotes element isolation width. And, $S_{min}$ denotes an area of the well electrode 1101.

Generally, between a well region and a light receiving unit, an insulating isolation region represented by the localized oxidation of silicon (LOCOS), the shallow trench isolation (STI) and the like is arranged. In FIG. 10, LOCOS 12 is arranged as such an element isolation region.

In arranging the element isolation region, the following restrictions are especially given from a viewpoint of an exposure process on production. Those are (1) the securement of the minimum separation width Lmin and (2) the securement of the minimum electrode area Smin.

In performing the miniaturization of a pixel, by the restrictions mentioned above, the light receiving area of a photodiode used as the light receiving unit becomes small, and the sensor performance has been worsened in terms of the optical property thereof, the saturated charge amount thereof, and the like.

Accordingly, it is an object of the present invention to provide a solid state image pickup device and a camera which do not worsen the sensor performance in terms of the optical property thereof, the saturated charge amount thereof, and the like.

SUMMARY OF THE INVENTION

As means for solving the problem mentioned above, the present invention is a solid state image pickup device including a pixel region having a plurality of pixels, the solid state image pickup device provided with at least a light receiving unit and an amplifying portion amplifying photocharges outputted from the light receiving unit in the pixel region, and further provided with a first semiconductor region for regulating potential of a well region, in which the amplifying portion is arranged, wherein no element isolation regions made of insulators are arranged between a first impurity region and the light receiving unit.

Moreover, the present invention is a solid state image pickup device including a pixel region having a plurality of pixels on a semiconductor substrate, the solid state image pickup device provided with at least a light receiving unit and an amplifying portion amplifying photocharges from the light receiving unit in the pixel region, and further provided with a first semiconductor region for regulating potential of a well region, in which the amplifying portion is arranged, and a silicon nitride film arranged between the semiconductor substrate and a wiring layer so as to cover at least a part of the light receiving unit, wherein the silicon nitride film is not arranged on the first semiconductor region.

Moreover, the present invention is characterized by an optical system, a diaphragm limiting an amount of light passing the optical system, and the above-mentioned solid state image pickup device receiving the light passing the diaphragm.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

In the following, the best embodiments for implementing the present invention are described with reference to the attached drawings.

First Embodiment

Figure 1:
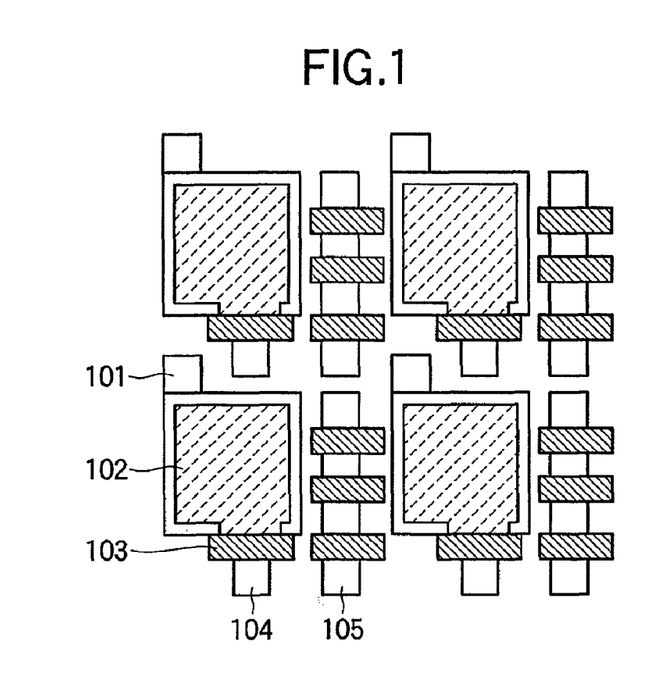
FIG. 1 is a plan view of a first embodiment of the present invention.
Figure 2:
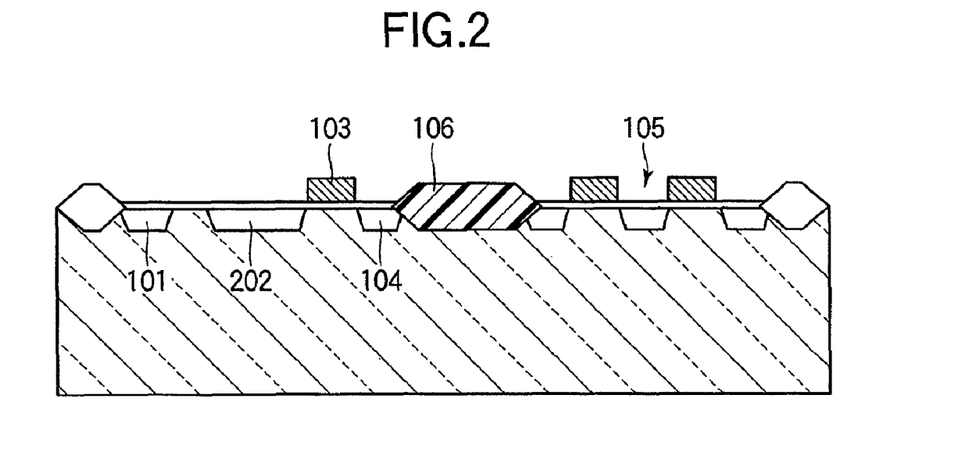
FIG. 2 is a sectional view of the first embodiment of the present invention.

FIG. 1 is a plan view of a first embodiment of the present invention, and FIG. 2 is a sectional view of the first embodiment of the present invention.

The present embodiment is an image pickup device including photodiodes each composed of an N type semiconductor region 202 formed in a P type semiconductor region (well).

In FIGS. 1 and 2, a reference numeral 101 denotes a well region connecting semiconductor region (P type semiconductor region). A reference numeral 102 denotes a photodiode to become a photoelectric conversion element. A reference numeral 103 denotes a transfer switch transferring charges from the photodiode 102. A reference numeral 104 denotes a charge conversion unit for converting a signal charge into a voltage. A reference numeral 105 denotes a metal oxide semiconductor (MOS) transistor unit provided according to uses such as the resetting of the charge conversion unit and the amplification of a signal charge. The reference numeral 202 denotes the N type semiconductor region constituting the photodiode. In fact, an electrode is connected to the well electrode 101 through a contact hole. The well electrode 101 is formed for regulating the potential of a well in which an amplifying element for amplifying the signal charge is formed.

As shown in FIG. 2, no element isolation regions such as the LOCOS are arranged between the well electrode 101 and the photodiode 102. That is, the well electrode 101 is arranged in the same active region as the photodiode 102.

On the other hand, an element isolation region 106 by the LOCOS is arranged between the MOS transistor units 105.

In order to avoid a dark current originated in a defect of a LOCOS end, the N type semiconductor region 202 is arranged to be away from the LOCOS end.

According to the present embodiment, because no element isolation regions by the LOCOS is arranged between the well electrode 101 and the light receiving unit of the photodiode 102, it becomes unnecessary to form any offset region for suppressing the dark current. Instead of the element isolation region, an offset region is formed between the N type semiconductor region 202 and the well electrode 101.

The reason is that, when the N type semiconductor region 202 and the well electrode 101 are touched with each other directly, the touch becomes a cause of the dark current.

As a result, the space of the amount of the distance of the element isolation region 106 can be saved. The amount of the distance of the element isolation region 106 is 0.7 μm in the present embodiment.

Moreover, in the prior art, 2 μm$^2$ of the area has been required as the well region.

However, according to the present embodiment, because the active region for the well region is connected to the active region of the photodiode, the active region for the well region may satisfy to be 2 μm$^2$ or more in total, and it becomes possible that the area of the impurity region for the well region is even 0.64 μm$^2$.

As a result, the space of 1 μm$^2$ or more can be decreased owing to the effect of the configuration.

Second Embodiment

Figure 3:
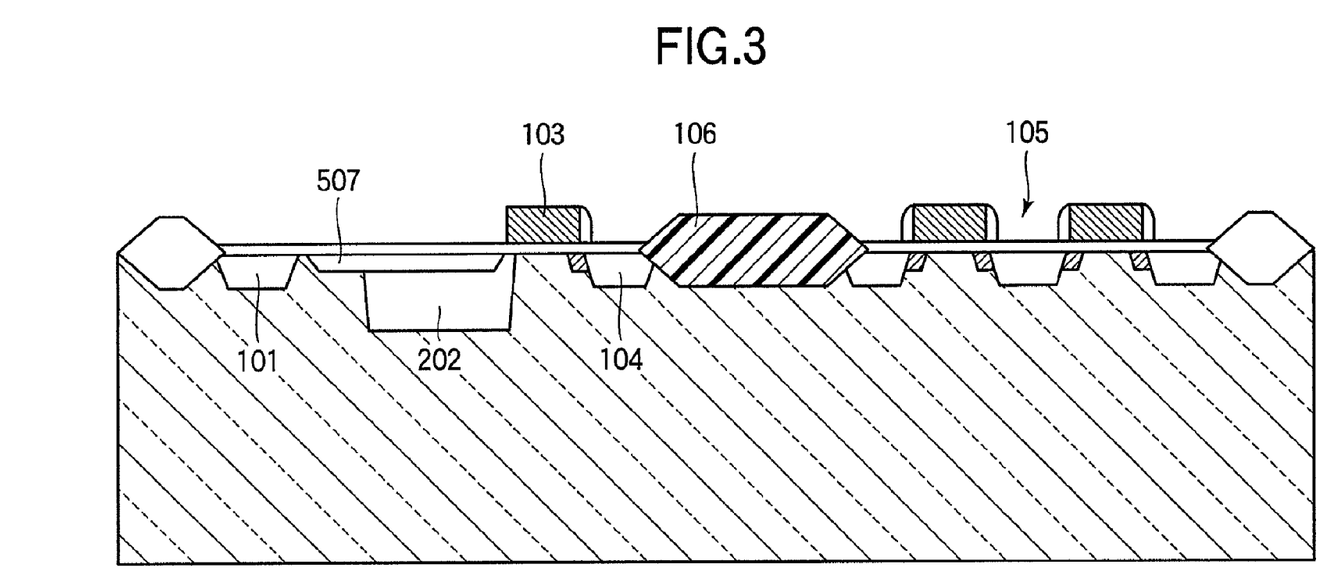
FIG. 3 is a sectional view of a second embodiment of the present invention.

FIG. 3 is a sectional view of a second embodiment of the present invention. The same reference characters as those in the first embodiment are given to the portions having the same functions as those of the first embodiment, and their descriptions are omitted.

The present embodiment differs from the first embodiment in that the present embodiment provides an image pickup device in which the buried photodiode 102 is formed in a P type semiconductor region.

The buried photodiode structure is constructed by arranging a P type semiconductor region 507 on the surface of the photodiode. As is apparent from the drawing, the well region is arranged up to a deeper position in the semiconductor substrate in comparison with the P type semiconductor region on the surface on the basis of a principal surface of the semiconductor substrate on which the photodiode is arranged, as a reference.

Also in the present embodiment, because the element isolation region 106 by the LOCOS is not arranged between the well electrode 101 and the photodiode 102, it becomes unnecessary to form the offset region for suppressing the dark current, and an offset region is formed between the N type semiconductor region 202 and the well electrode 101 instead.

As an effect of the space saving according to the present embodiment, 1.7 μm can be obtained.

Third Embodiment

Figure 4:
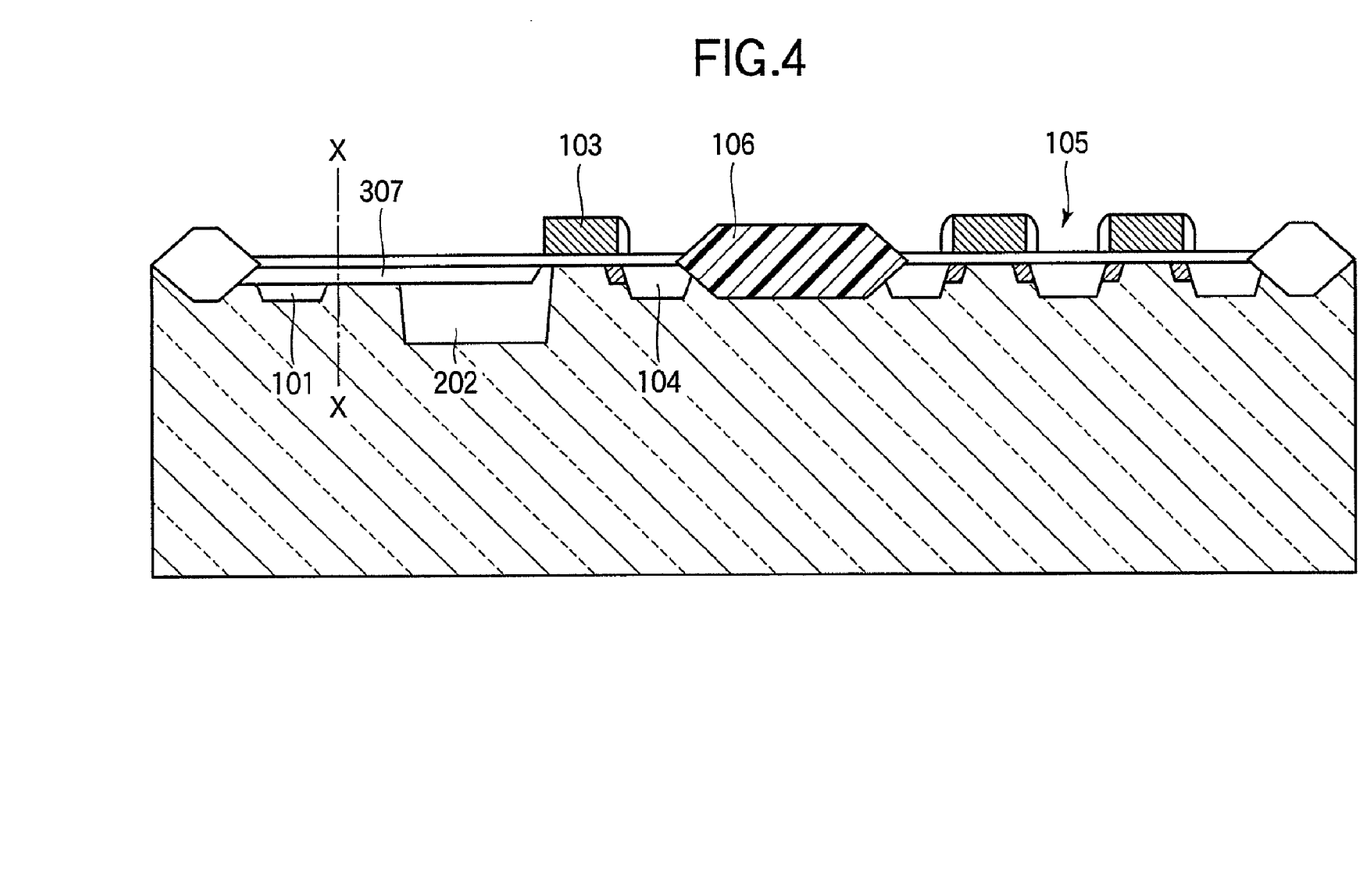
FIG. 4 is a sectional view of a third embodiment of the present invention.

FIG. 4 is a sectional view of a third embodiment of the present invention.

Figure 5:
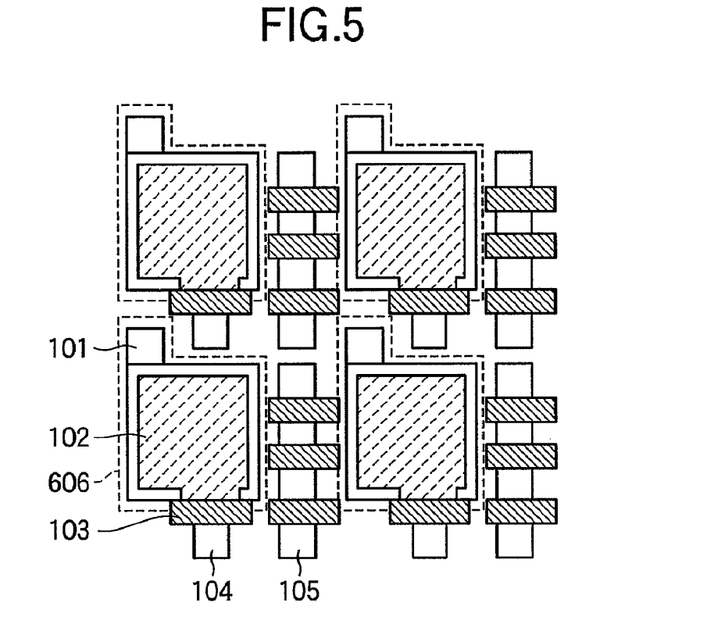
FIG. 5 is a plan view of the third embodiment of the present invention.

The present embodiment differs from the second embodiment in that the present embodiment forms the P type semiconductor region to extend over the well region. That is, a surface P region 606 is arranged as shown in FIG. 5. As is apparent from the drawings, the well region is arranged up to a deeper position in the semiconductor substrate in comparison with the P type semiconductor region on the surface on the basis of a principal surface of the semiconductor substrate on which the photodiode is arranged, as a reference.

By adopting such a configuration, it becomes possible to suppress the unevenness of dark currents.

The dark current of the photodiode 102 contains a generation current component generated from a defect existing in a depletion layer, and a diffusion current component generated from the density difference between electrons and holes in a PN junction surface. As one of the sources of the diffusion current component, there is the well electrode 101.

That is, the position of the well electrode 101 and the impurity density from the well electrode 101 to the N type semiconductor region 202 is one of the primary factors determining the diffusion current component.

As the second embodiment, when a surface P region 307 is stopped at an X position in the drawing, i.e. when the surface P region 307 is formed as shown in FIG. 3, the position of the surface P region may overlap or may not overlap with the well electrode 101 in a surface according to the registration accuracy (shifts in the X direction, the Y direction and the Θ direction) and the dispersion of dimensions. That is sometimes seen as unevenness of dark currents.

That is, the density of the area between the well electrode 101 and the N type semiconductor region 202 may differ to every pixel, and it may be seen as unevenness. The unevenness becomes several percents of order of magnitude. Although there is no problem when a dark current value fluctuates to this extent on the whole, the unevenness may become conspicuous when a dark current difference arises at some positions in the same image pickup device.

In the present embodiment, because the surface P type semiconductor region 307 is extended to the well electrode 101, the dispersion of the density in the area between the well electrode 101 and the N type semiconductor region 202 in every pixel becomes nonexistent.

As a result, about 1.7 μm of pixel reduction can be obtained, and the dark current unevenness can be also suppressed.

Fourth Embodiment

Figure 6:
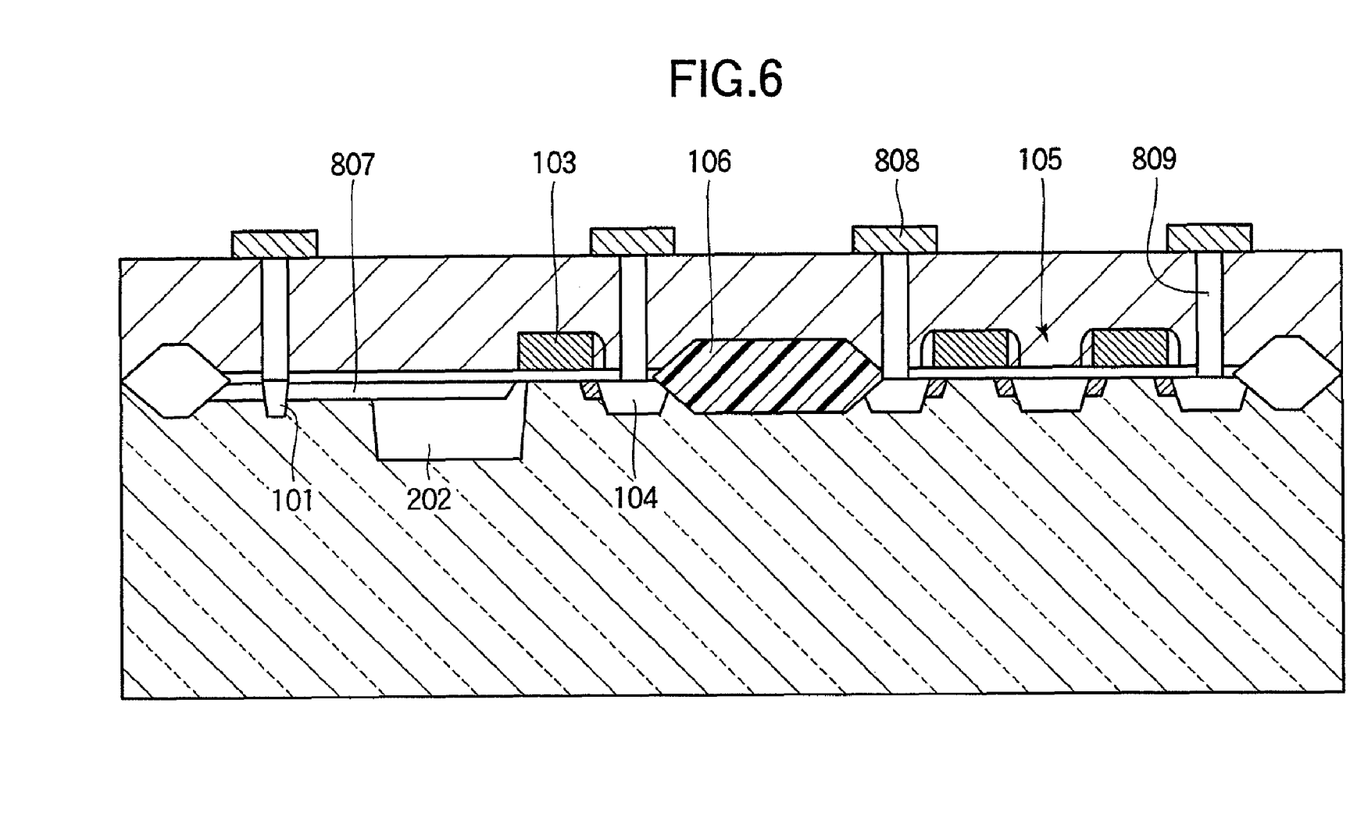
FIG. 6 is a sectional view of a fourth embodiment of the present invention.

FIG. 6 is a sectional view of a fourth embodiment of the present invention.

The present embodiment differs from the third embodiment in that no P⁺ regions formed by a P⁺ ion (for example, boron) implantation process for forming the sauce and the drain regions of a general MOS as the well electrode 101 are not used. Instead, after forming a contact hole for connecting a metal region with a semiconductor region, the well electrode 101 is formed by performing P⁺ ion implantation using the contract hole as a mask. As is apparent from the drawing, the well region is arranged to a deeper position of the semiconductor substrate compared with the surface P type semiconductor region on the basis of a principal surface of the semiconductor substrate on which the photodiode is arranged, as a reference.

Thereby, the space of the electric contact and the margin of an active region of about 0.2 μm can be saved. As a result, 1.9 μm of the pixel reduction can be achieved.

Fifth Embodiment

Figure 7:
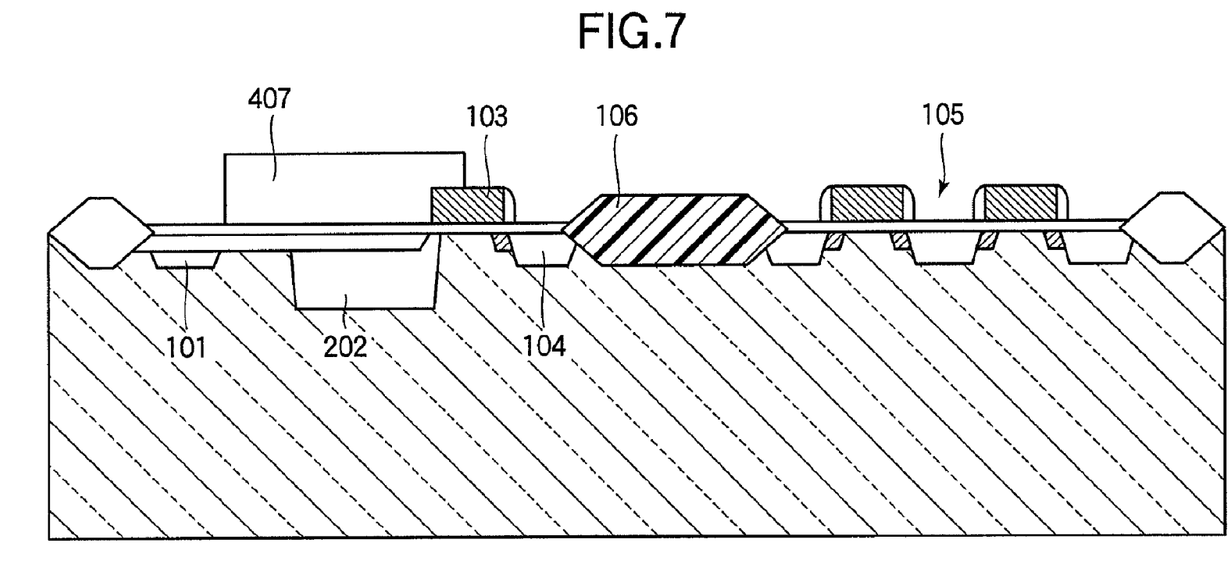
FIG. 7 is a sectional view of a fifth embodiment of the present invention.

FIG. 7 is a sectional view of a fifth embodiment of the present invention.

The feature of the present embodiment is to form a photodiode protection film 407 for protecting a photodiode from the damage of an etch back process of a lightly doped drain (LDD). As is apparent from the drawing, the well region is arranged to a deeper position of the semiconductor substrate compared with the surface P type semiconductor region on the basis of a principal surface of the semiconductor substrate on which the photodiode is arranged, as a reference.

In the present embodiment, the etch back process of the LDD is performed in a state in which a resist film is deposited at the position of a photodiode protection film 407 at the time of the LDD etch back.

Figure 8:
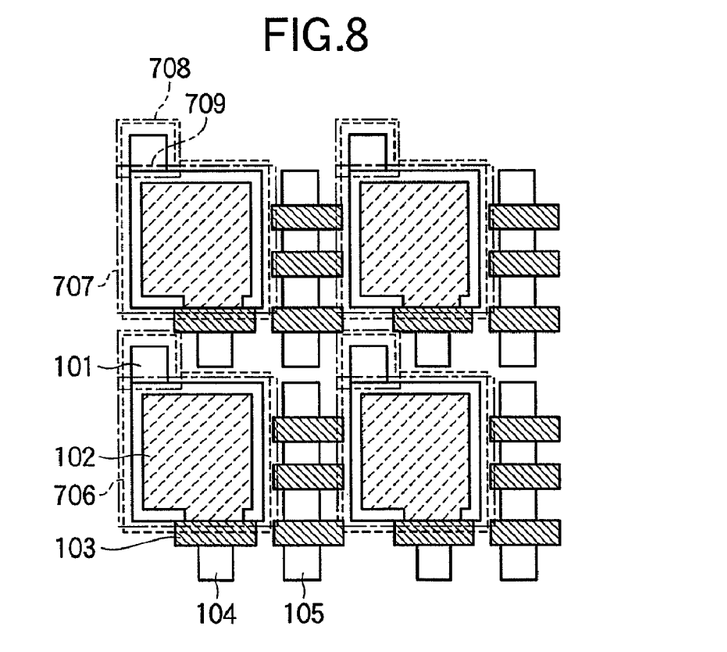
FIG. 8 is a plan view of the fifth embodiment of the present invention.

FIG. 8 is a plan view of the present embodiment. A structure in which an oxide film for a LDD remains on a photodiode is obtained.

The photodiode protection layer is arranged in the region surrounded by an alternate long and short dash line 707 in the drawing.

In the present embodiment, the well electrode 101 is formed in an area bordered by the protection layer.

That is, a resist aperture portion for performing P⁺ ion implantation for forming the well electrode 101 is made to extend also to a part of the photodiode protection layer.

Hereby, all of the active regions receiving etch back damages are made to be well regions.

According to the configuration of the present embodiment, space saving can be achieved, and the dark current unevenness described with regard to the third embodiment is also improved. The reason is as follows.

An active region having received damages owing to the registration accuracy (shifts in the X direction, the Y direction and the Θ direction) of the P⁺ semiconductor region for a well region and the dispersion of dimensions in the well region surface may exist or may not exist in an area between the well electrode 101 and the N type semiconductor region 102. Then, those damaged active regions can be seen as the unevenness of the dark current.

That is, because the damaged state of the semiconductor region between the well electrode 101 and the N type semiconductor region 202 differ from each other in every pixel, the damaged regions may be seen as the unevenness.

Because the resist aperture portion for the P⁺ ion implantation for forming the well electrode 101 is made to extend also on a part of the photodiode protection layer from the reason mentioned above, the unevenness of the dark current can be more suppressed.

Sixth Embodiment

The photodiode protection layer is formed as follows in the fifth embodiment.

An 8 nm of a silicon oxide film, a 50 nm of silicon nitride film, and a 500 nm of a silicon oxide film are formed from the surface of the semiconductor in the order.

As a result, in addition to the effect of the fifth embodiment, the laminated structure of the silicon oxide film and the silicon nitride film performs an anti-reflection function, and the improvement in sensitivity can been also improved by about 20%.

Seventh Embodiment

Figure 9:
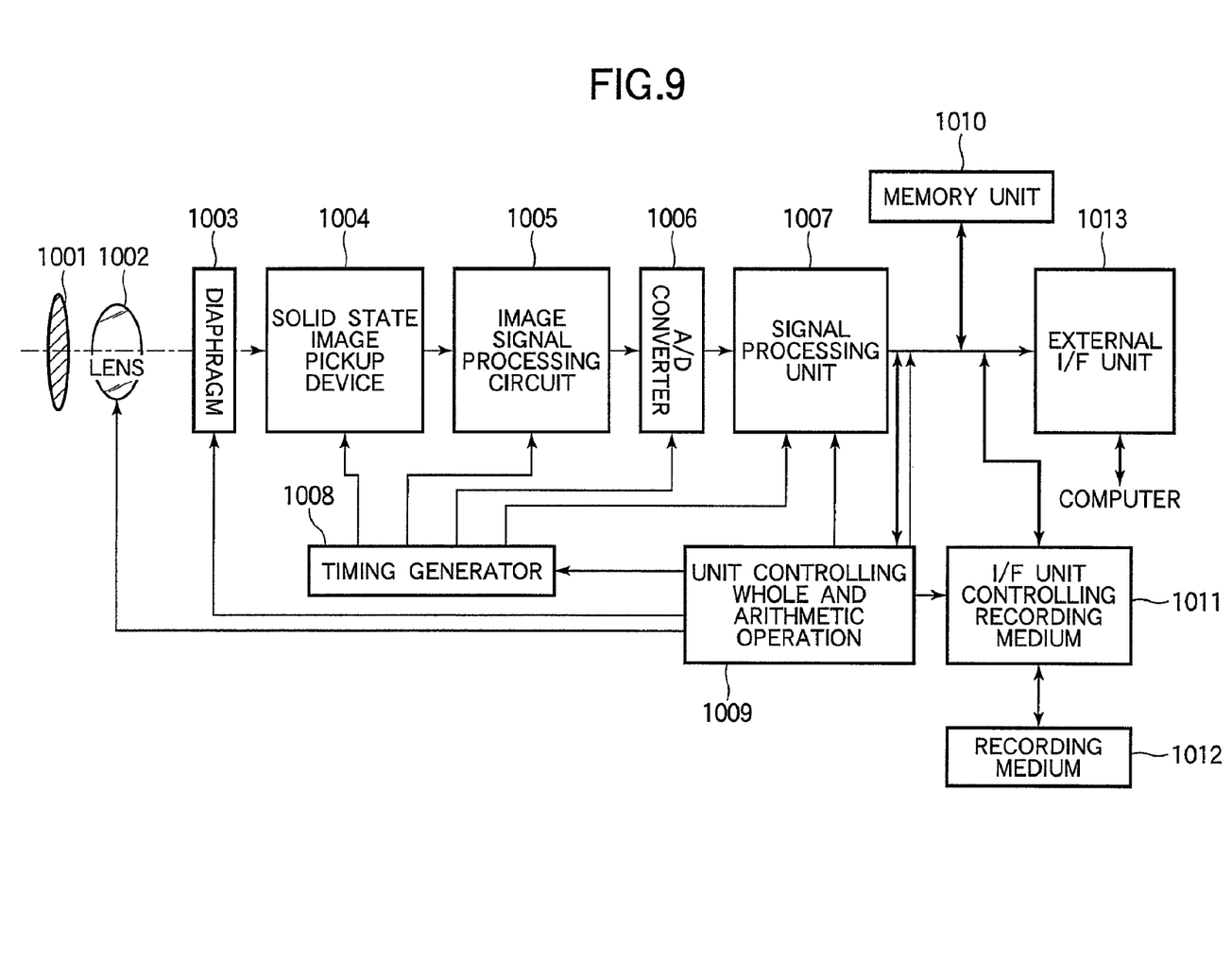
FIG. 9 is a view showing an example of the circuit block in case of applying a solid state image pickup device according to the present invention to a camera.

FIG. 9 shows an example of a circuit block in the case of applying an image pickup device according to the present invention to a camera.

A shutter 1001 is provided before a photographing lens 1002, and the shutter 1001 controls exposure. A light amount is controlled by a diaphragm 1003 as the need arises, and the light is made to perform image formation on an image pickup device 1004.

A signal outputted from the image pickup device 1004 is processed by a signal processing circuit 1005, and is converted into a digital signal from an analog signal by an A/D converter 1006.

The operation processing of the digital signal outputted from the A/D converter 1004 is further performed by a signal processing unit 1007.

The processed digital signal is stored in a memory 1010, or is transmitted to an external apparatus through an external I/F unit 1013.

The image pickup device 1004, the image signal processing circuit 1005, the A/D converter 1006, and the signal processing unit 1007 are controlled by a timing generator 1008, and also the whole system is controlled by a unit controlling whole and arithmetic operation unit 1009.

In order to record an image on a recording medium 1012, an output digital signal is recorded through an I/F unit controlling recording medium 1011 controlled by the unit controlling whole and arithmetic operation unit 1012.

This application claims priority from Japanese Patent Application No. 2004-254362 filed on Sep. 1, 2004, which is hereby incorporated by reference herein.

What is claimed is:

1. A solid-state image pickup device comprising a pixel region that includes a plurality of pixels, wherein
    the pixel region includes at least a photo-receiving portion,
        an amplifying portion for amplifying a photo carrier outputted from the photo-receiving portion, and a first semiconductor region for defining a potential of a well region in which the amplifying portion is arranged,
    the photo-receiving portion includes a second semiconductor region for accumulating the photo carrier,
    an element isolation region of an insulator is not arranged between the first semiconductor region and the second semiconductor region,
    a third semiconductor region of a conductivity type opposite to that of the second semiconductor region is arranged on a surface of the second semiconductor region and above the first semiconductor region, and
    the first semiconductor region is arranged deeper than the third semiconductor region.

2. A solid-state image pickup device comprising a pixel region that includes a plurality of pixels, wherein
    the pixel region includes at least a photo-receiving portion,
        an amplifying portion for amplifying a photo carrier outputted from the photo-receiving portion, and a first semiconductor region for defining a potential of a well region in which the amplifying portion is arranged,
    the photo-receiving portion includes a second semiconductor region for accumulating the photo carrier,
    a third semiconductor region of a conductivity type opposite to that of the second semiconductor region is arranged on a surface of the second semiconductor region and above the first semiconductor region,
    the first semiconductor region is arranged in an active region within the second semiconductor region, and
    the first semiconductor region is arranged deeper than the third semiconductor region.

\* \* \* \* \*